(12) United States Patent
Chen et al.

(10) Patent No.: US 8,604,555 B1
(45) Date of Patent: Dec. 10, 2013

(54) SEMICONDUCTOR STRUCTURE AND MANUFACTURING METHOD OF THE SAME

(71) Applicant: Macronix International Co., Ltd., Hsinchu (TW)

(72) Inventors: Shih-Hung Chen, Jhudong Township, HsinChu County (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/649,232

(22) Filed: Oct. 11, 2012

(51) Int. Cl.
*H01L 29/94* (2006.01)

(52) U.S. Cl.
USPC .............. 257/382; 438/675; 257/E29.116

(58) Field of Classification Search
USPC ............ 257/382, E29.116, E29.121; 438/675
See application file for complete search history.

(56) References Cited

U.S. PATENT DOCUMENTS 7,696,556 B2 *  4/2010  Hur et al. ..................... 257/315

* cited by examiner

*Primary Examiner* — Quoc Hoang
(74) *Attorney, Agent, or Firm* — McClure, Qualey & Rodack, LLP

(57) ABSTRACT

A semiconductor structure and a manufacturing method of the same are provided. The semiconductor structure includes a substrate, a gate dielectric layer, a gate structure, a source conductive structure, a drain conductive structure, and a gate conductive structure. The substrate has a channel area. The gate dielectric layer is formed on the channel area, and the gate structure is formed on the gate dielectric layer. The source conductive structure and the drain conductive structure penetrate through the gate structure and are electrically connected to the substrate, and the source conductive structure and the drain conductive structure are electrically isolated from the gate structure. The gate conductive structure is formed on the gate structure. The source conductive structure and the drain conductive structure are separated by a distance which is equal to a length of the channel area.

20 Claims, 20 Drawing Sheets

SEMICONDUCTOR STRUCTURE AND MANUFACTURING METHOD OF THE SAME

BACKGROUND OF THE INVENTION

1. Field of the Invention

The disclosure relates in general to a semiconductor structure and a manufacturing method of the same, and more particularly to a semiconductor structure and a manufacturing method of the same for logic process.

2. Description of the Related Art

In a typical semiconductor manufacturing process, the active region and the channel width are defined first, which is the shallow trench isolation (STI) process, and then the channel length is defined in the gate electrode manufacturing process. Next, the N−/P− region is defined and formed according to the gate electrode. And then, the gate spacer is formed according to the relief structure of the gate electrode followed by the definition of the N+/P+ region assisted by the gate spacer. Finally, after the interlayer dielectric (ILD) insulating layer is formed, in the following contact formation process, the contacts are formed aiming to the N+/P+ region. In the typical manufacturing process, the formation of STI/gate electrode/contacts has to follow the strictest design rules of the manufacturing process. Therefore, the costs as well as the difficulty of the manufacturing process are relatively high.

SUMMARY OF THE INVENTION

The invention is directed to a semiconductor structure and a manufacturing method of the same, which can be used in logic process and memory devices. A drain conductive structure and a source conductive structure are defined through a gate electrode, such that the formation of the drain conductive structure and the source conductive structure and the definition of a length of a channel area are simplified in one module. As a result, the original complicated manufacturing processes are thus simplified, and such simplified processes loosen the design rules of the gate electrode, which is good for lowering the costs of the manufacturing processes. In addition, the formation of a gate structure and the definition of the range of an active region are performed in one manufacturing process, which simplifies the whole manufacturing processes.

According to one embodiment of the present disclosure, a semiconductor structure is provided. The semiconductor structure comprises a substrate, a gate dielectric layer, a gate structure, a source conductive structure, a drain conductive structure, and a gate conductive structure. The substrate has a channel area. The gate dielectric layer is formed on the channel area, and the gate structure is formed on the gate dielectric layer. The source conductive structure and the drain conductive structure penetrate through the gate structure and are electrically connected to the substrate, and the source conductive structure and the drain conductive structure are electrically isolated from the gate structure. The gate conductive structure is formed on the gate structure. The source conductive structure and the drain conductive structure are separated by a distance which is equal to a length of the channel area.

According to one embodiment of the present disclosure, a method of manufacturing a semiconductor structure is provided. The method comprises following steps: forming a gate dielectric layer on a substrate; forming a gate structure on the gate dielectric layer; forming a source conductive structure and a drain conductive structure on the substrate, wherein the source conductive structure and the drain conductive structure penetrate through the gate structure and are electrically connected to the substrate, and the source conductive structure and the drain conductive structure are electrically isolated from the gate structure; and forming a gate conductive structure on the gate structure. The substrate has a channel area, and the source conductive structure and the drain conductive structure are separated by a distance which is equal to a length of the channel area.

The disclosure will become apparent from the following detailed description of the preferred but non-limiting embodiments. The following description is made with reference to the accompanying drawings.

DETAILED DESCRIPTION OF THE INVENTION

In the embodiment of the present disclosure, a semiconductor structure and a manufacturing method of the same are provided. The length of a channel area is determined by the distance between a drain conductive structure and a source conductive structure of the semiconductor structure. Further, forming a gate structure and defining the range of an active region can be performed in one manufacturing process, such that the whole manufacturing processes can be simplified. The embodiments disclosed below are for elaborating the semiconductor structure of the disclosure. However, the descriptions disclosed in the embodiments of the disclosure such as detailed structures, manufacturing procedures, operating procedures, and material selections are for illustration only, not for limiting the scope of protection of the disclosure.

Figure 1A:
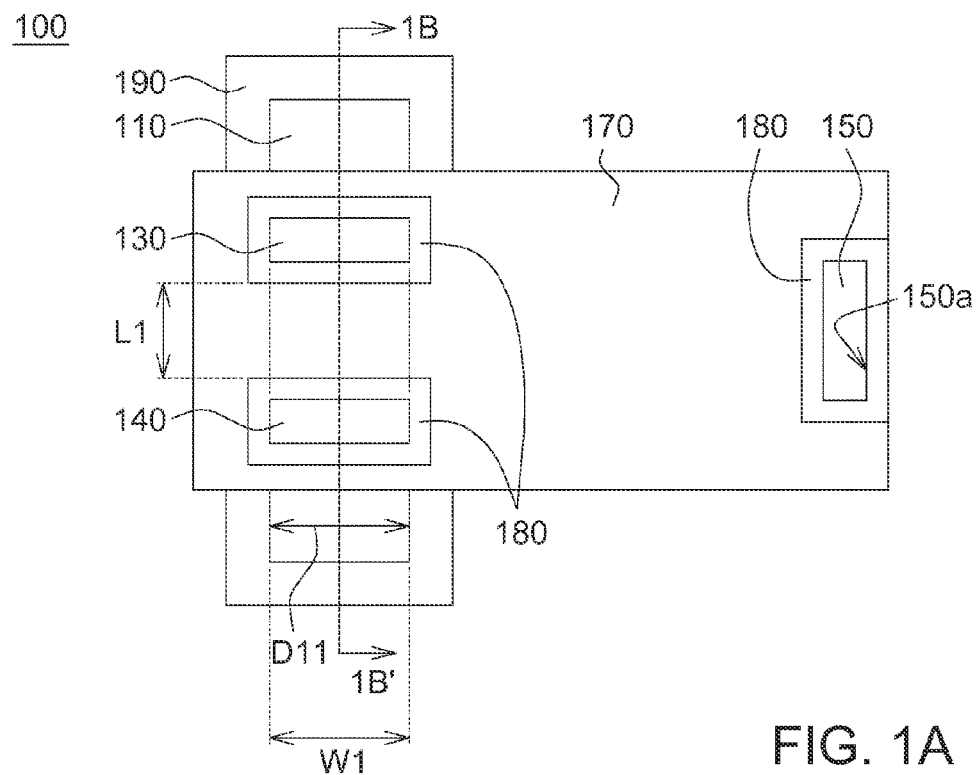
FIG. 1A shows a top view of a semiconductor structure according to a first embodiment of the present disclosure.
Figure 1B:
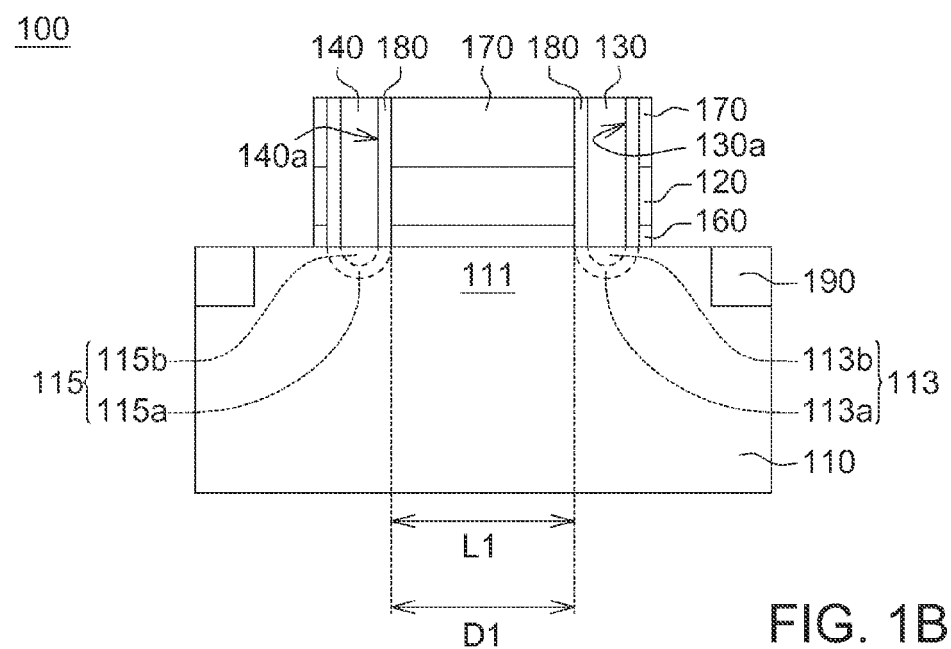
FIG. 1B shows a cross-sectional view along the section line 1B-1B' in FIG. 1A.

FIG. 1A shows a top view of a semiconductor structure according to a first embodiment of the present disclosure. FIG. 1B shows a cross-sectional view along the section line 1B-1B' in FIG. 1A. Please refer to FIGS. 1A-1B. Semiconductor structure 100 comprises a substrate 110, a gate dielectric layer 160, a gate structure 120, a drain conductive structure 130, a source conductive structure 140, and a gate conductive structure 150. The substrate has a channel area 111, and the channel area 111 has a length L1. The gate dielectric layer 160 is formed on the channel area 111, and the gate structure 120 is formed on the gate dielectric layer 160. The drain conductive structure 130 and the source conductive structure 140 are formed on the substrate 110. The drain conductive structure 130 and the source conductive structure 140 penetrate through the gate structure 120 and are electrically connected to the substrate 110, and the drain conductive structure 130 and the source conductive structure 140 are electrically isolated from the gate structure 120. The gate conductive structure 150 is formed on the gate structure 120. The drain conductive structure 130 and the source conductive structure 140 are separated by a distance D1 which is equal to the length L1 of the channel area 111. That is to say, the distance D1 between the drain conductive structure 130 and the source conductive structure 140 determines the length L1 of the channel area 111.

Conventionally, a channel length is defined by shallow trench isolation (STI) followed by a gate electrode formation process to define a channel width. And then, processes of photolithography, ion implantation, and formation of spacers are carried out to form a source area and a drain area. Last, an interlayer dielectric (IDL) is formed followed by performing a contact window (contact hole) process. In this invention, the distance D1 between the drain conductive structure 130 and the source conductive structure 140 determines the length L1 of the channel area 111, such that the length L1 of the channel area 111 can be controlled and the source conductive structure 130 and the source conductive structure 140 can be defined at the same time.

In the embodiment, as shown in FIG. 1A, the drain conductive structure 130 and the source conductive structure 140 are defined on and through the relatively large gate structure 120, such that an N−/P− region can be defined at the same time while performing the contact process (formation of the drain conductive structure 130 and the source conductive structure 140). And then, after a spacer 180 is formed, an N+/P+ region and the contacts are self-aligned formed. As such, the formation of the drain conductive structure 130 and the source conductive structure 140 and the definition of the length L1 of the channel area 111 can be simplified in one module. As a result, the original complicated manufacturing processes can be simplified, the design rules of the gate electrode are relaxed, and the manufacturing costs are reduced.

In the embodiment, as shown in FIGS. 1A-1B, the gate structure 120 is located on the same side respect to the drain conductive structure 130 and the source conductive structure 140. The semiconductor structure 100 can comprise an insulating structure 190 formed on the substrate 110. The insulating structure surrounds the substrate 110, and a part of the surface of the substrate 110 is exposed form the insulating structure 190. In the embodiment, as shown in FIG. 1A, a width W1 of the channel area 111 is equal to a width D11 of the part of the surface exposed from the insulating structure 190. In other words, the range that the insulating structure 190 surrounds defines the width W1 of the channel area 111.

As shown in FIGS. 1A-1B, in the embodiment, the semiconductor structure 100 can comprise an insulating layer 170. The insulating layer 170 is formed on the substrate 110 and located between the gate conductive structure 150, the drain conductive structure 130, and the source conductive structure 140. In one embodiment, as shown in FIGS. 1A-1B, the insulating layer 10 surrounds the peripheries of the gate conductive structure 150, the drain conductive structure 130, and the drain conductive structure 140.

As shown in FIGS. 1A-1B, in the embodiment, the semiconductor structure 100 can comprise a spacer 180. The spacer 180 is formed on a sidewall 130a of the drain conductive structure 130 and a sidewall 140a of the source conductive structure 140. In the embodiment, the spacer 180 is also formed on a sidewall 150a of the gate conductive structure 150. In one embodiment, as shown in FIG. 1A, the spacer 180 surrounds the peripheries of the gate conductive structure 150, the drain conductive structure 130, and the drain conductive structure 140. The material of the spacer 180 comprises an insulating material, such as silicon nitride or silicon oxide.

In the embodiment, as shown in FIG. 1B, for example, the spacer 180 is formed between the gate structure 120 and the drain conductive structure 130 and between the gate structure 120 and the source conductive structure 140.

In one embodiment, as shown in FIG. 1B, the spacer 180 is such as in direct contact with the gate structure 120, the drain conductive structure 130, and the source conductive structure 140. In the embodiment, for example, the spacer 180 fully covers the sidewall 130a of the drain conductive structure 130 and the sidewall 140a of the source conductive structure 140. The spacer 180 is conformal with the sidewall 130a of the drain conductive structure 130 and the sidewall 140a of the source conductive structure 140. In the embodiment, as shown in FIG. 1B, the gate structure 120 and the drain conductive structure 130 are spaced apart by only the spacer 180, and the gate structure 120 and the source conductive structure 140 are spaced apart by only the spacer 180. The spacer 180 can prevent the electronic interferences from occurring between the gate structure 120 and the drain conductive structure 130 and between the gate structure 120 and the source conductive structure 140.

In one embodiment, as shown in FIG. 1A, the shape of the cross-sections of the gate conductive structure 150, the source conductive structure 130, and the drain conductive structure 140 is, for example, rectangular. In the embodiment, the shape of the cross-sections of the gate conductive structure 150, the source conductive structure 130, and the drain conductive structure 140 is rectangular, and the length of the drain conductive structure 130 and the drain conductive structure 140 parallel to the width W1 of the channel area is such as larger than or equal to the width D11 of the part of the surface of the substrate 110 exposed from the insulating structure 190. The width W1 of the channel area 111 is determined by the width D11, and the length L1 of the channel area 111 is determined by the manufacturing process of the contacts (the drain conductive structure 130 and the source conductive structure 140). The width W1 and the length L1 of the channel area 111 are clearly defined, as such, the semiconductor structure 100 as shown in FIG. 1A has a similar I-V curve to that of a semiconductor structure made by typical manufacturing processes. In the embodiment, these cross-sections can also be oval-shaped, linear, or have other shapes. However, the shape selections are depending on the conditions applied and are not limited to the shapes aforementioned. In one embodiment, as shown in FIG. 1B, the substrate 110 is such as a polysilicon substrate.

As shown in FIG. 1B, in one embodiment, the semiconductor structure 100 can comprise a drain area 113 and a source area 115. The drain area 113 and the source area 115 are formed in the substrate 110. The drain area 113 is located adjacent to the drain conductive structure 130, and the source area 115 is located adjacent to the source conductive structure 140. In the embodiment, the drain area 113 and the source area 115 can independently comprise a first type doping area 113a, 115a, and a second type doping area 113b, 115b. The first type doping areas 113a and 115a are such as located under the drain conductive structure 130 and the source conductive structure 140, respectively. The first type doping areas 113a and 115a are such as N−/P− doping regions, and the ranges of which are determined by the peripheries of the spacers 180 (e.g. the ranges of the holes, in which the drain conductive structure 130 and the source conductive structure 140 are to be formed, before the spacers 180 are formed). The second type doping areas 113b and 115b are located between the drain conductive structure 130 and the first doping area and between the source conductive structure 140 and the first doping area, respectively. The second type doping areas 113b and 115b are such as N+/P+ doping regions, and the ranges of which are determined by the inner edges of the spacers 180 (e.g. the ranges of the drain conductive structure 130 and the source conductive structure 140).

Figure 2A:
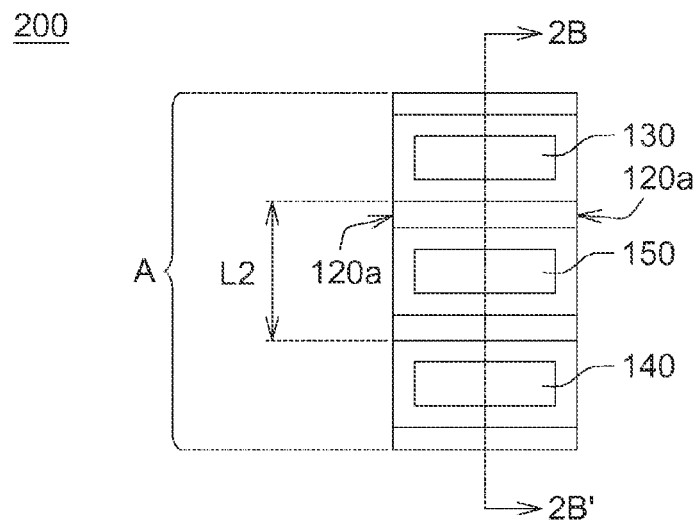
FIG. 2A shows a top view of a semiconductor structure according to a second embodiment of the present disclosure.
Figure 2B:
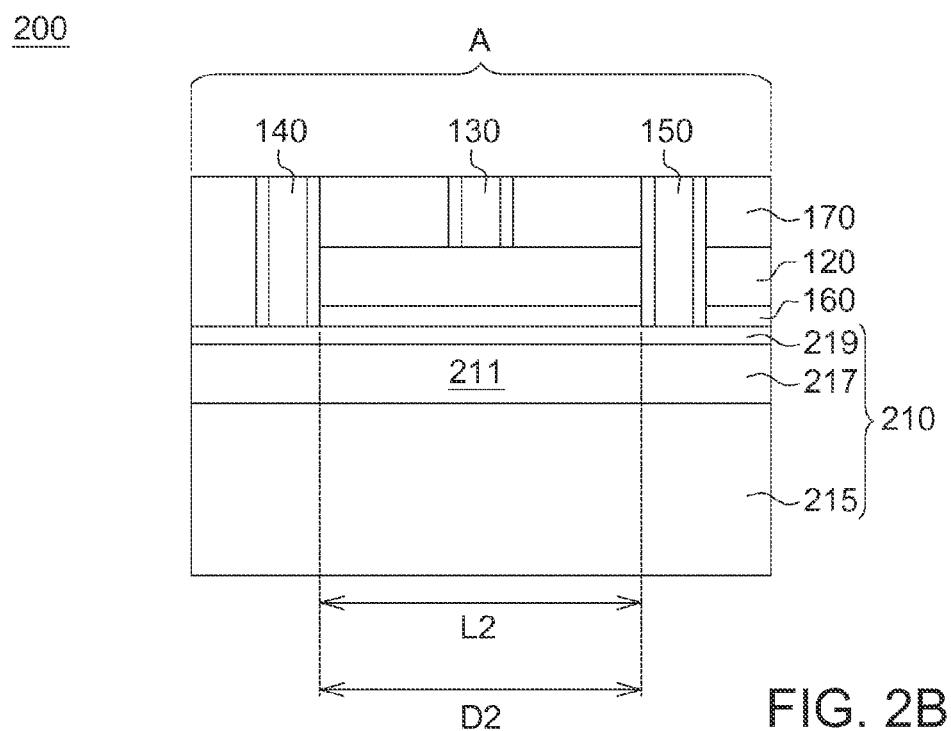
FIG. 2B shows a cross-sectional view along the section line 2B-2B' in FIG. 2A.

FIG. 2A shows a top view of a semiconductor structure according to a second embodiment of the present disclosure. FIG. 2B shows a cross-sectional view along the section line 2B-2B' in FIG. 2A. In one embodiment, as shown in FIG. 2A, the gate conductive structure 150 is such as disposed between the drain conductive structure 130 and the source conductive structure 140. In one embodiment, in the semiconductor structure 200, the shape of the cross-sections of the gate conductive structure 150, the source conductive structure 130, and the drain conductive structure 140 is, for example, rectangular. Similar to the embodiment as shown in FIG. 1A, the width and the length of the channel area 211 are clearly defined, as such, the semiconductor structure 200 as shown in FIG. 2A has an I-V curve similar to that of a semiconductor structure made by typical manufacturing processes. In the embodiment, these cross-sections can also be oval-shaped, linear, or have other shapes. However, the shape selections are depending on the conditions applied and are not limited to the shapes aforementioned.

In the embodiment, as shown in FIGS. 2A-2B, the drain conductive structure 130 and the source conductive structure 140 are separated by a distance D2 which is equal to a length L2 of the channel area 211. That is to say, the distance D2 between the drain conductive structure 130 and the source conductive structure 140 determines the length L2 of the channel area 211.

In an embodiment, as shown in FIGS. 2A-2B, semiconductor structure 200 is such as a metal oxide semiconductor (MOS), and the area where the gate structure 120 covers can be an active region A. In other words, the range of the gate structure 130 defines the active region A of the semiconductor structure 200.

Please refer to FIG. 2B, in one embodiment, the substrate 210 is such as a SOI (silicon on insulator) substrate, comprising a substrate body 215, a silicon oxide layer 217, and a silicon layer 219. However, the substrate selections are depending on the conditions applied and are not limited to the types aforementioned.

Figure 3A:
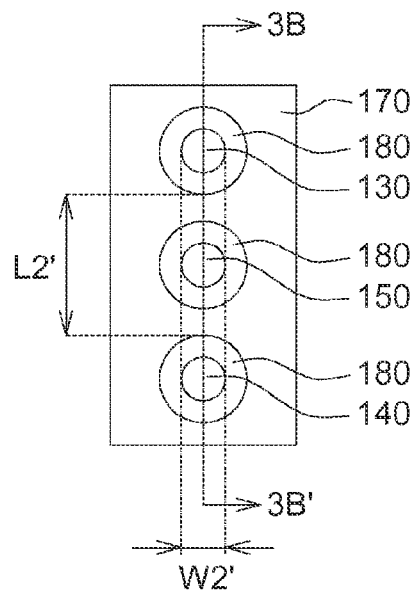
FIG. 3A shows a top view of a semiconductor structure according to a third embodiment of the present disclosure.
Figure 3B:
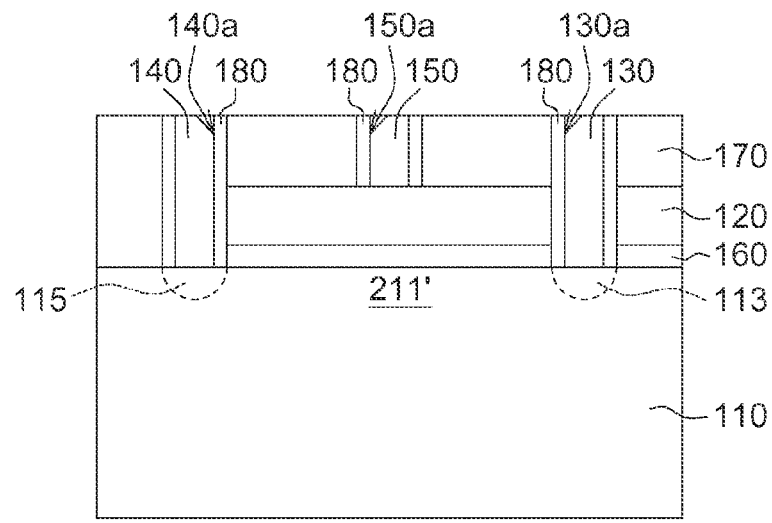
FIG. 3B shows a cross-sectional view along the section line 3B-3B' in FIG. 3A.

FIG. 3A shows a top view of a semiconductor structure according to a third embodiment of the present disclosure. FIG. 3B shows a cross-sectional view along the section line 3B-3B' in FIG. 3A. In one embodiment, as shown in FIG. 3A, the shape of the cross-sections of the gate conductive structure 150, the source conductive structure 130, and the drain conductive structure 140 is, for example, round.

Figure 3C:
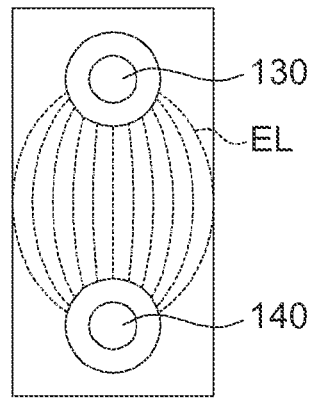
FIG. 3C shows a schematic view of the power lines between the drain conductive structure 130 and the source conductive structure 140 in FIG. 3A.

FIG. 3C shows a schematic view of the power lines between the drain conductive structure 130 and the source conductive structure 140 in FIG. 3A. When the shape of the cross-sections of the source conductive structure 130 and the drain conductive structure 140 is round, the length L2' and the width W2' of the channel area 211' are less clearly defined. As shown in FIG. 3C, the power lines EL close to the middle of the region between the drain conductive structure 130 and the source conductive structure 140 are substantially straight lines. The power lines EL close to the outer sides of the region between the two conductive structures 130 and 140 are curved lines, and the curved lines are bending more outwards when moving away from the region between the two conductive structures 130 and 140. Under such circumstance, the semiconductor structure 300 as shown in FIG. 3C has an I-V curve different from that of a semiconductor structure made by typical manufacturing processes. To a certain level, the I-V curve of the semiconductor structure 300 is similar to that of a plurality of semiconductor structures arranged in parallel, each having channel areas of different lengths and widths. As such, the I-V curve of the semiconductor structure 300 is more complicated than that of a semiconductor structure made by typical manufacturing processes. Although having a more complicated I-V curve, with the advantages of simplified manufacturing processes and lower manufacturing costs, the semiconductor structure 300 can be used in suitable logic process after fine characterization.

Figure 4:
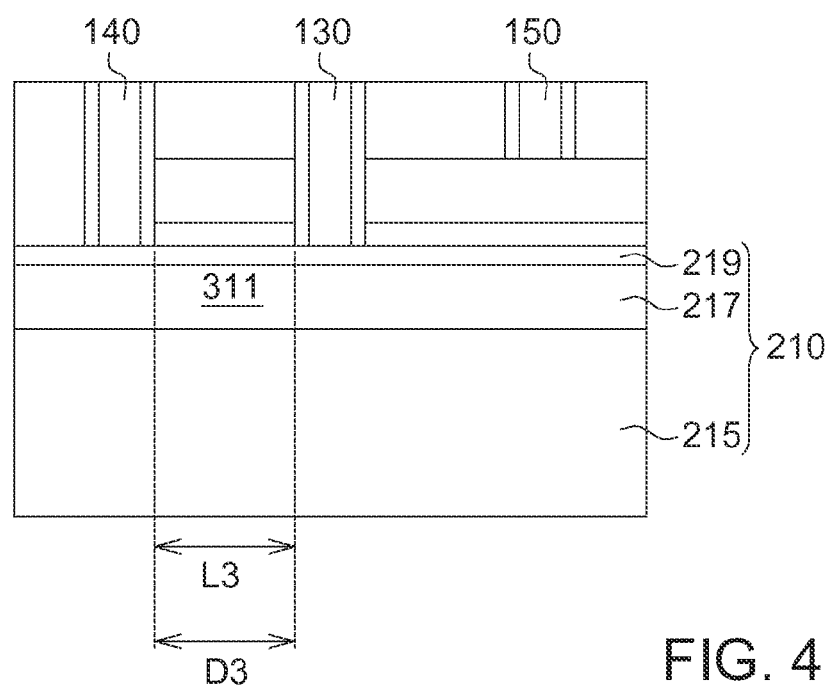
FIG. 4 shows a top view of a semiconductor structure according to a fourth embodiment of the present disclosure.

FIG. 4 shows a top view of a semiconductor structure according to a fourth embodiment of the present disclosure. Please refer to FIG. 4, in one embodiment, the gate conductive structure 150 is not disposed between the drain conductive structure 130 and the source conductive structure 140. For example, the gate conductive structure 150 is disposed on the same side of the drain conductive structure 130 and the source conductive structure 140. As shown in FIG. 4, the drain conductive structure 130 is such as disposed between the gate conductive structure 150 and the source conductive structure 140. In the embodiment, the channel area 311 is located in the silicon layer 219. The distance D3 between the drain conductive structure 130 and the source conductive structure 140 is equal to the length L3 of the channel area 311. That is to say, the distance D3 between the drain conductive structure 130 and the drain conductive structure 140 determines the length L3 of the channel area 311.

Figure 5A:
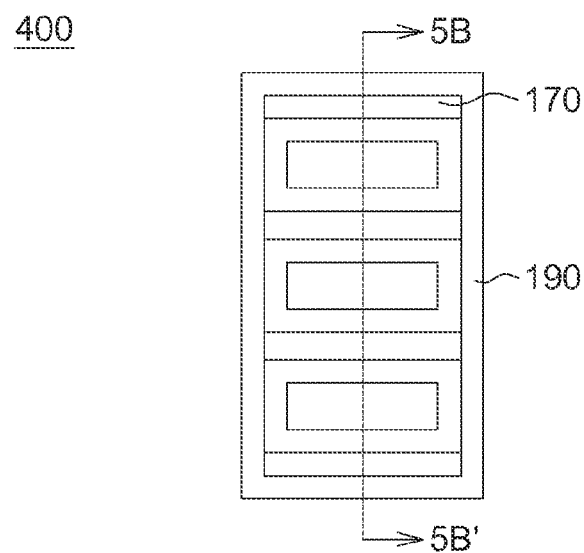
FIG. 5A shows a top view of a semiconductor structure according to a fifth embodiment of the present disclosure.
Figure 5B:
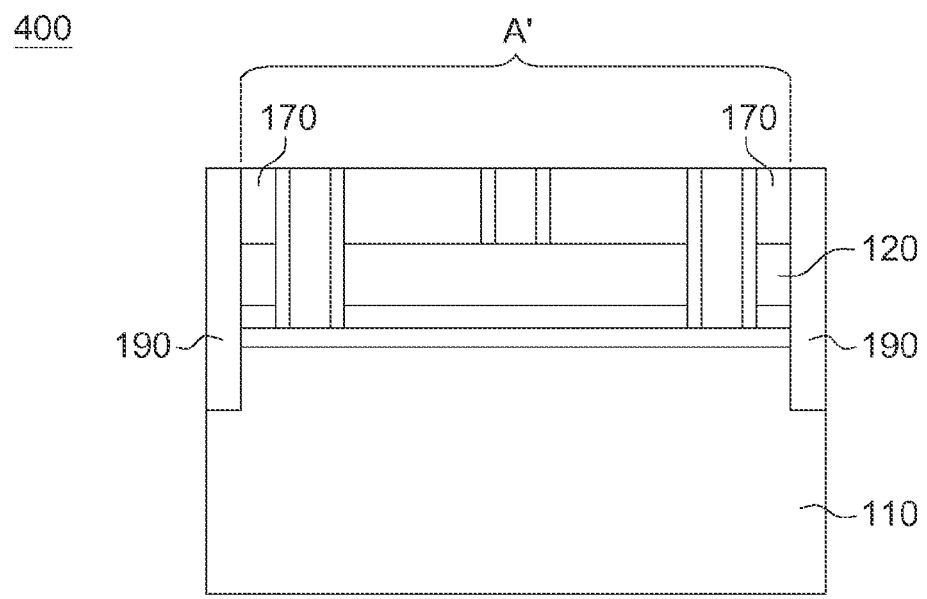
FIG. 5B shows a cross-sectional view along the section line 5B-5B' in FIG. 5A.

FIG. 5A shows a top view of a semiconductor structure according to a fifth embodiment of the present disclosure. FIG. 5B shows a cross-sectional view along the section line 5B-5B' in FIG. 5A. Please refer to FIGS. 5A-5B. In one embodiment, the semiconductor structure 400 can comprise an insulating structure 190. The insulating structure 190 is formed on the substrate 110 and surrounding the gate structure 120. In the embodiment, the insulating structure 190 and the insulating layer 170 can be formed in different manufacturing processes, having different materials. The insulating structure 190 and the insulating layer 170 can also be formed in the same manufacturing process and have the same materials. In one embodiment, the semiconductor structure 400 is such as a metal oxide semiconductor, and the area surrounded by the insulating structure 190 can be an active region A'. In other words, the insulating structure 190 defines the active region A' of the semiconductor structure 400. In one embodiment, the sides of the insulating structure 190 adjacent to the periphery of the gate structure 120 are such as conformal with the periphery of the gate structure 120.

Figure 6A:
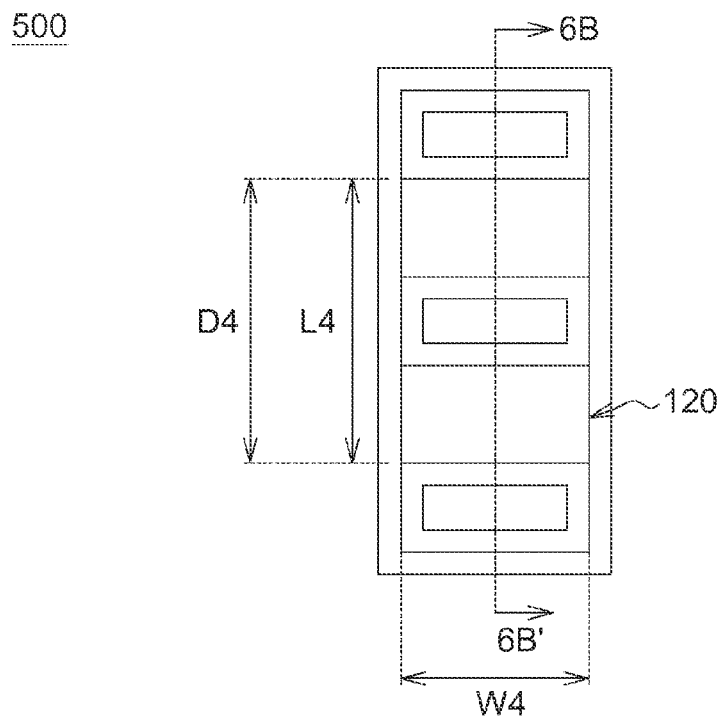
FIG. 6A shows a top view of a semiconductor structure according to a sixth embodiment of the present disclosure.
Figure 6B:
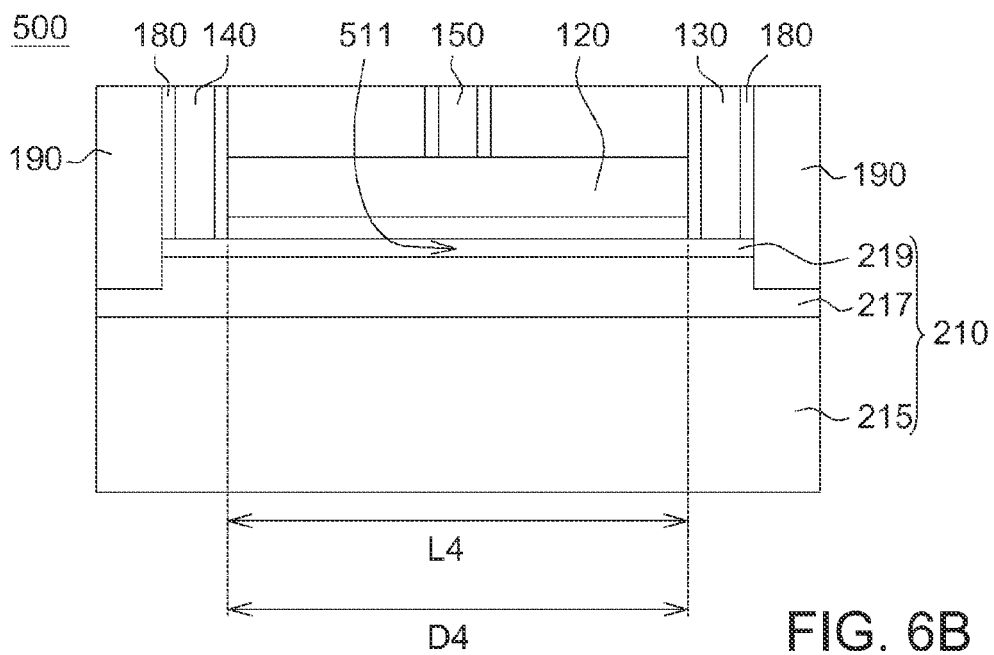
FIG. 6B shows a cross-sectional view along the section line 6B-6B' in FIG. 6A.

FIG. 6A shows a top view of a semiconductor structure according to a sixth embodiment of the present disclosure. FIG. 6B shows a cross-sectional view along the section line 6B-6B' in FIG. 6A. Please refer to FIGS. 6A-6B. In one embodiment, the drain conductive structure 130 and the source conductive structure 140 are disposed on the two sides of the gate structure 120 and adjacent to the insulating structure 190. In the embodiment, as shown in FIGS. 6A-6B, the spacer 180 is such as formed between the insulating structure 190 and the drain conductive structure 130 and between the insulating structure 190 and the source conductive structure 140. The spacer 180 is, for example, in direct contact with the insulating structure 190, the drain conductive structure 130, and the source conductive structure 140. In the embodiment, the channel area 511 is located in the silicon layer 219. The distance D4 between the drain conductive structure 130 and the source conductive structure 140 is equal to the length L4 of the channel area 511. That is to say, the distance D4 between the drain conductive structure 130 and the source conductive structure 140 determines the length L4 of the channel area 511.

In the embodiment, as shown in FIG. 6A, the channel area 511 is located below the gate structure 120. A width of the gate structure 120 is equal to a width W4 of the channel area 511. In other words, the width of the gate structure 120 defines the width W4 of the channel area 511.

Figure 7A:
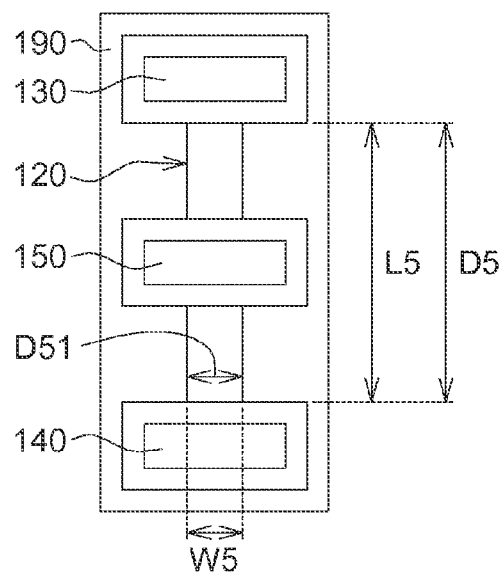
FIG. 7A-7C show top views of arrangements of a gate structure, a source conductive structure, a drain conductive structure, and a gate conductive structure of a semiconductor structure according to an embodiment of the present disclosure.
Figure 7B:
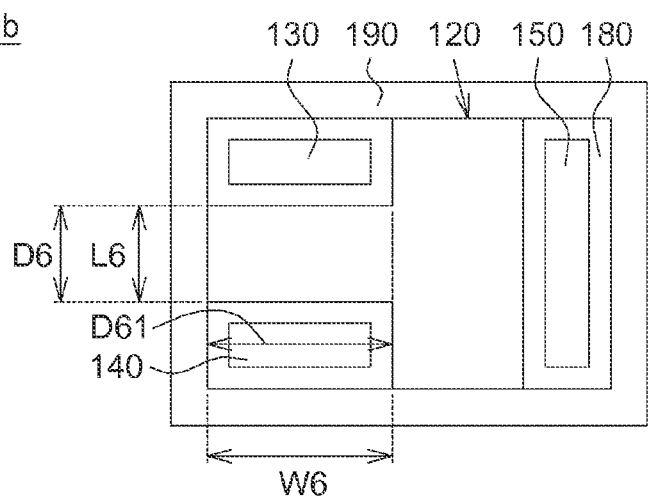
Figure 7C:
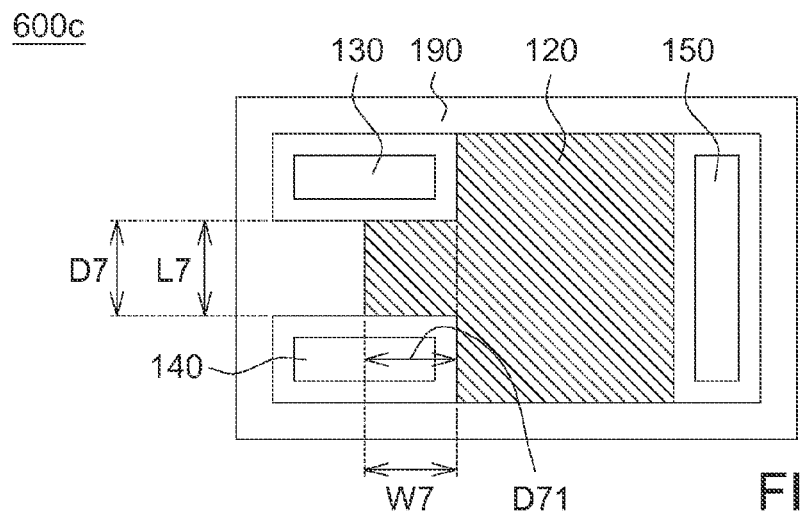

FIG. 7A-7C show top views of arrangements of a gate structure, a source conductive structure, a drain conductive structure, and a gate conductive structure of a semiconductor structure according to an embodiment of the present disclosure.

In one embodiment, as shown in FIG. 7A, the channel area of the semiconductor structure 600a is located below the gate structure 120. The distance D5 between the drain conductive structure 130 and the source conductive structure 140 is equal to the length L5 of the channel area. The insulating structure 190 is located adjacent to the sidewalls of the gate structure 120 and surrounds the gate structure 120, and the width D51 of the gate structure 120 is equal to the width W5 of the channel area. That to say, the distance D5 between the drain conductive structure 130 and the source conductive structure 140 determines the length L5 of the channel area, and the insulating structure 190 defines the width W5 of the channel area.

In one embodiment, as shown in FIG. 7B, the channel area of the semiconductor structure 600b is located below the gate structure 120. The distance D6 between the drain conductive structure 130 and the source conductive structure 140 is equal to the length L6 of the channel area. The width W6 of the channel area is equal to the width D61 of the .drain conductive structure 130 and the source conductive structure 140 along a direction vertical to the channel length L6. That to say, the distance D6 between the drain conductive structure 130 and the source conductive structure 140 determines the length L6 of the channel area, and the width D61 of the .drain conductive structure 130 and the source conductive structure 140 determines the width W6 of the channel area.

In one embodiment, as shown in FIG. 7C, the channel area of the semiconductor structure 600c is located below the gate structure 120. The distance D7 between the drain conductive structure 130 and the source conductive structure 140 is equal to the length L7 of the channel area. Please be noted that, to clearly show the length L7 of the channel area and the range of the gate structure 120, the gate structure 120 is denoted with dashed lines in FIG. 7C. The width W7 of the channel area is equal to the width D71 of the part of the drain conductive structure 130 and the source conductive structure 140 overlapping the gate structure 120. That to say, the distance D7 between the drain conductive structure 130 and the source conductive structure 140 determines the length L7 of the channel area, and the width D71 of the drain conductive structure 130 and the source conductive structure 140 overlapping the gate structure 120 determines the width W7 of the channel area.

Figure 8:
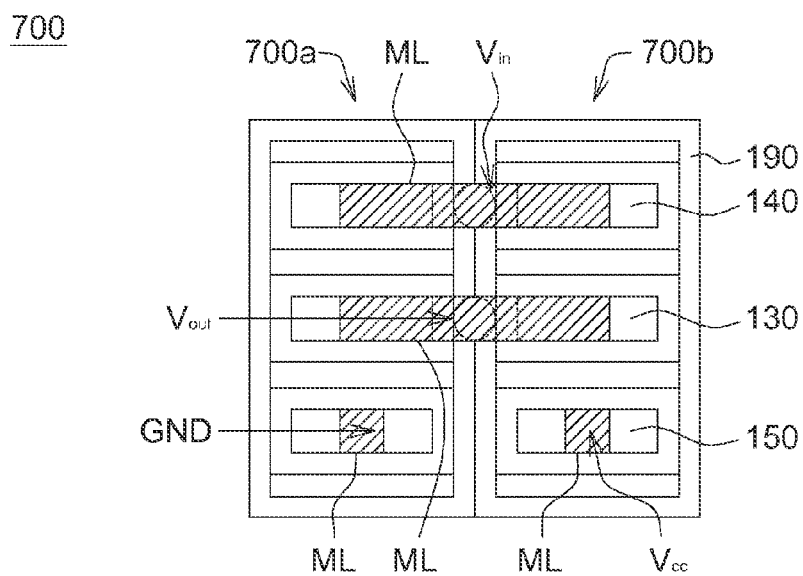
FIG. 8 shows a top view of a semiconductor device according to an embodiment of the present disclosure.
Figure 9:
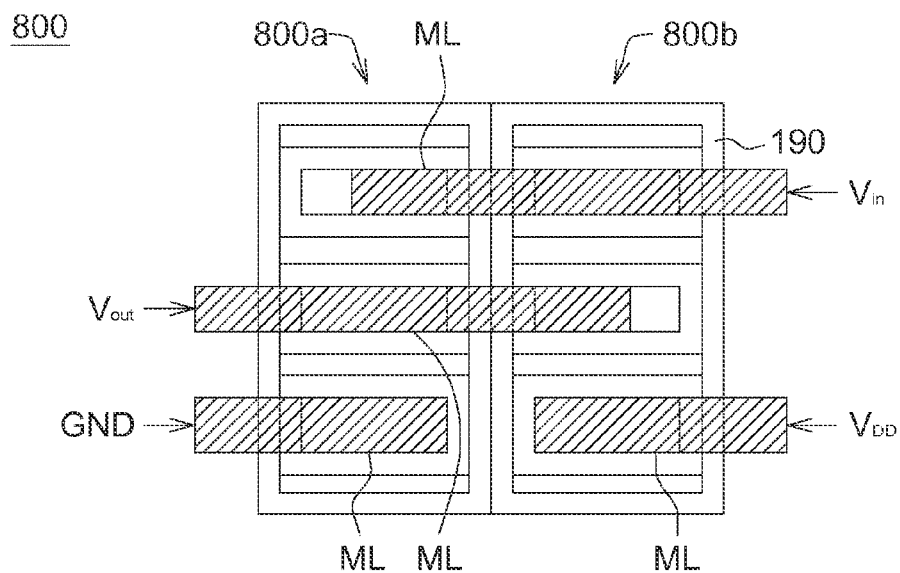
FIG. 9 shows a top view of a semiconductor device according to another embodiment of the present disclosure.

FIG. 8 shows a top view of a semiconductor device according to an embodiment of the present disclosure. FIG. 9 shows a top view of a semiconductor device according to another embodiment of the present disclosure. Please refer to FIG. 8. Semiconductor device 700 comprises two semiconductor structures 700a and 700b disposed adjacent to each other. The two drain conductive structures 130, two source conductive structures 140, and the two gate conductive structures 150 in the two semiconductor structures 700a and 700b are electrically connected through a plurality of metal lines ML. The semiconductor structures 600a and 600b are spaced apart by the insulating structure 190 for preventing the electronic interferences between each other. As shown in FIG. 8, the metal line ML connected to the source conductive structures 140 has a voltage input end $V_{in}$, the metal line ML connected to the drain conductive structures 130 has a voltage output end $V_{out}$, and the voltage input end $V_{in}$ and voltage output end $V_{out}$ are disposed between the two semiconductor structures 700a and 700b where the insulating structure 190 is located. The gate conductive structures 150 of the two semiconductor structures 700a and 700b are connected to working voltage input end $V_{CC}$ and grounding end GND, respectively.

As shown in FIG. 9, in the semiconductor structures 800a and 800b, the metal line ML connected to the source conductive structures 140 has a voltage input end $V_{in}$, the metal line ML connected to the drain conductive structures 130 has a voltage output end $V_{out}$, and the voltage input end $V_{in}$ and voltage output end $V_{out}$ are disposed on the two sides of the two semiconductor structures 800a and 800b, respectively. The gate conductive structures 150 of the two semiconductor structures 800a and 800b are connected to working voltage input end $V_{DD}$ and grounding end GND, respectively.

In one embodiment, the semiconductor structures 700a/800a and the semiconductor structures 700b/800b are such as n type metal oxide semiconductors (NMOS) and p type metal oxide semiconductors (PMOS), respectively, and the semiconductors 700/800 are such as inverters, which can be applied on static random access memories (SRAM).

The embodiments disclosed below are for elaborating a manufacturing method of the semiconductor structures of the disclosure. However, the descriptions disclosed in the embodiments of the disclosure such as detailed manufacturing procedures are for illustration only, not for limiting the scope of protection of the disclosure.

Figure 10:
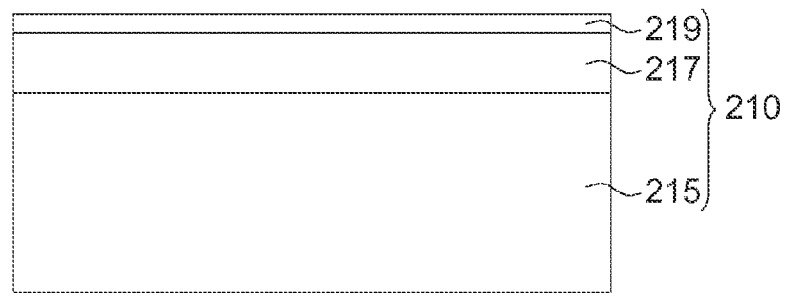
FIGS. 10-17B illustrate a process for manufacturing a semiconductor structure according to one embodiment of the present disclosure.

FIGS. 10-17B illustrate a process for manufacturing a semiconductor structure according to one embodiment of the present disclosure. Referring to FIG. 10, a substrate 210 is provided. In the embodiment, the substrate 210 is such as a SOI substrate, comprising a substrate body 215, a silicon oxide layer 217, and a silicon layer 219. However, the substrate selections are depending on the conditions applied and are not limited to the types aforementioned.

Figure 11:
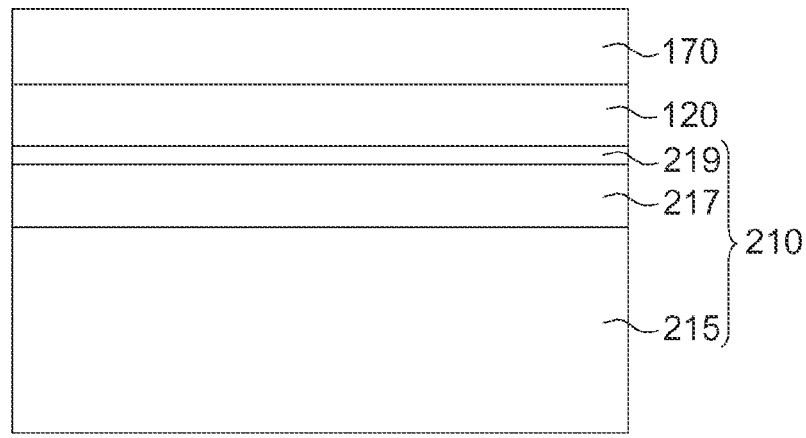

Referring to FIG. 11, a gate dielectric layer 160 is formed on the substrate 210, and a gate structure 120 is formed on the gate dielectric layer 160. In the embodiment, the gate structure 120 is formed by such as a mask etching process. Next, an insulating layer 170 is formed on the substrate 210. In the embodiment, the insulating layer 170 is formed on the gate structure 120. In the embodiment, the materials for the gate dielectric layer 160 and the insulating layer 170 are such as silicon oxide, and the material for the gate structure 120 is such as polysilicon. However, the material selections are depending on the conditions applied and are not limited to the materials aforementioned.

Next, referring to FIGS. 12A-15B, a source conductive structure 140 and a drain conductive structure 130 are formed on the substrate 210, wherein the source conductive structure 140 and the drain conductive structure 130 penetrate through the gate structure 120 and are electrically connected to the substrate 110, and the source conductive structure 140 and the drain conductive structure 130 are electrically isolated from the gate structure 120, and a gate conductive structure 150 is formed on the gate structure 120.

Figure 12A:
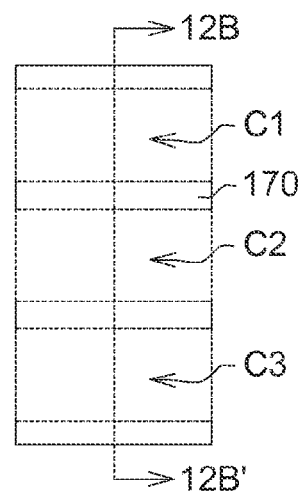
Figure 12B:
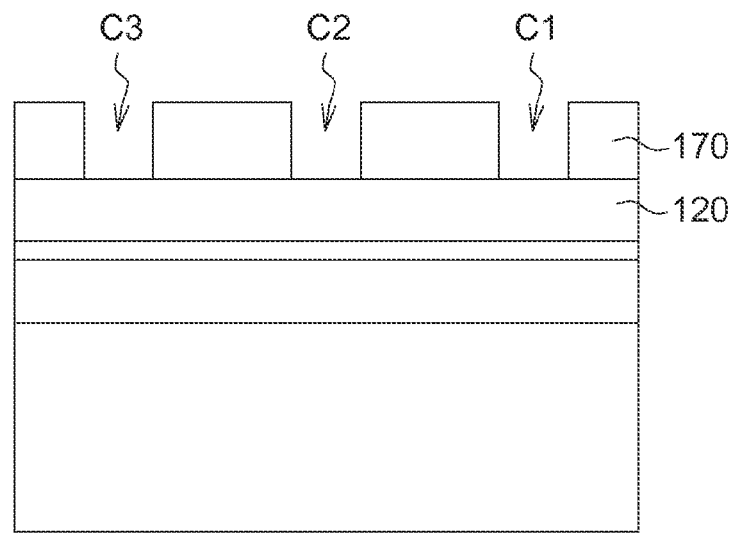
Figure 13A:
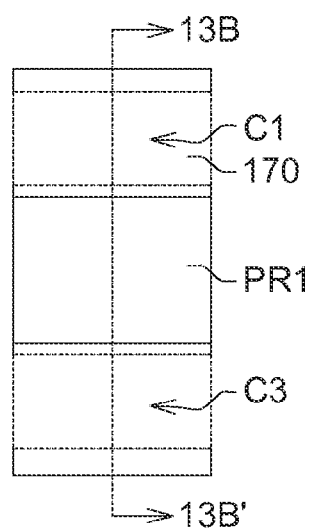
Figure 13B:
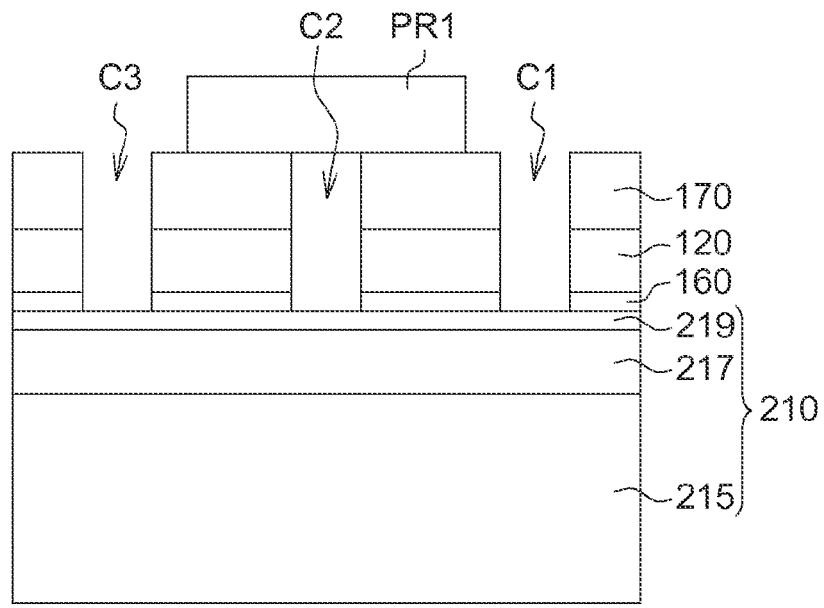

In the embodiment, the manufacturing method of forming the source conductive structure 140, the drain conductive structure 130, and the gate conductive structure 150 such as comprises the following steps. As shown in FIGS. 12A-12B (FIG. 12B shows a cross-sectional view along the section line 102-12B' in FIG. 12A), holes C1, C2, and C3 are formed in the insulating layer. The heights of holes C1, C2, and C3 extend from a top surface of the insulating layer 170 to the interface between the insulating layer 170 and the gate structure 120. In the embodiment, the holes C1, C2, and C3 are formed by such as an etching process. Next, as shown in FIGS. 13A-13B (FIG. 13B shows a cross-sectional view along the section line 13B-13B' in FIG. 13A), a photoresist PR1 is disposed above the hole C2, and then, the gate structure 120 and the gate dielectric layer 160 below the holes C1 and C3 are etched, such that the heights of holes C1 and C3 extend to the interface of the gate dielectric layer 160 and the substrate 210. In one embodiment, as shown in FIG. 13B, holes C1 and C3 can extend into the silicon layer 219.

Figure 14A:
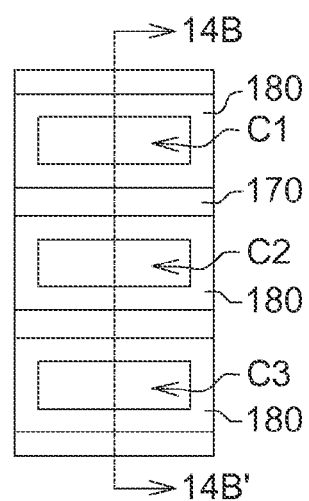
Figure 14B:
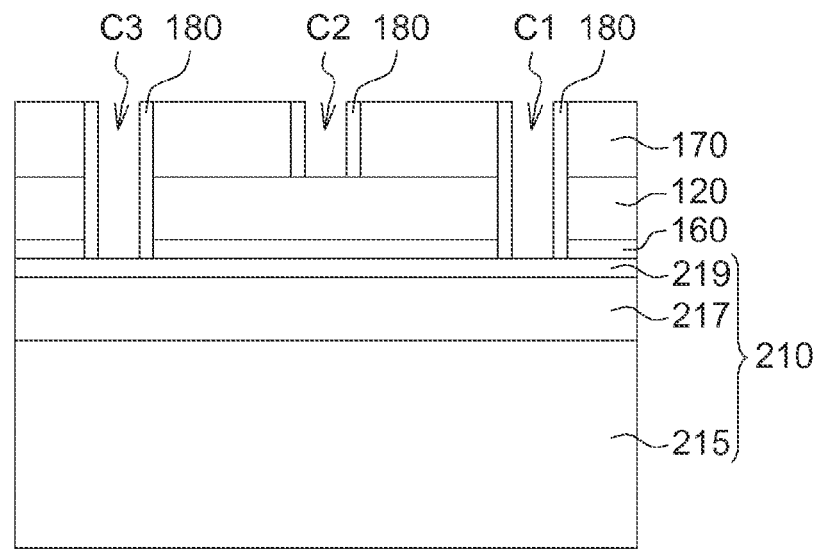
Figure 15A:
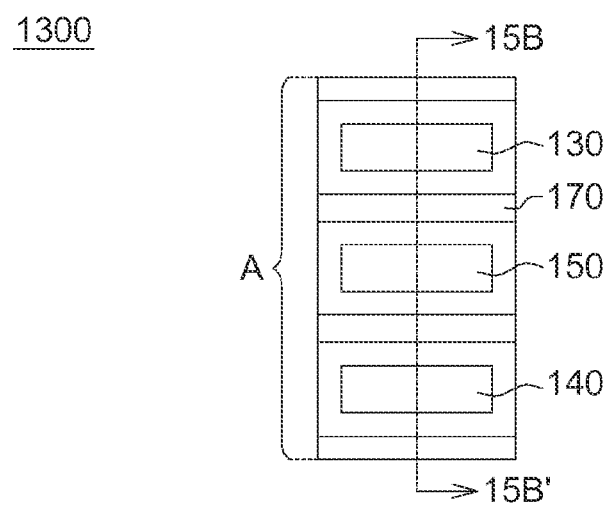
Figure 15B:
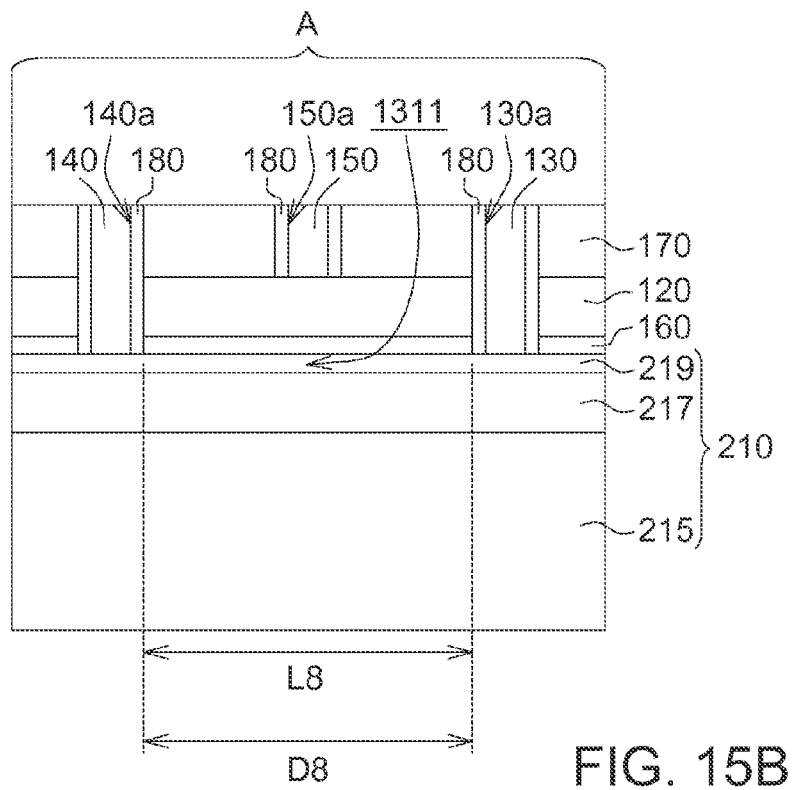

Next, as shown in FIGS. 14A-14B (FIG. 14B shows a cross-sectional view along the section line 14B-14B' in FIG. 14A), a spacer 180 is formed the sidewalls of the holes C1, C2, and C3. In the embodiment, as shown in FIGS. 14A-14B, the sidewalls of the holes C1, C2, and C3 are fully covered by the spacer 180. Next, as shown in FIGS. 15A-15B (FIG. 15B shows a cross-sectional view along the section line 15B-15B' in FIG. 15A), a conductive material is filled in the holes C1, C2, and C3 to form the drain conductive structure 130, the gate conductive structure 150, and the source conductive structure 140 in the holes C1, C2, and C3, respectively. As such, the drain conductive structure 130 and the source conductive structure 140 penetrate through the gate structure 120 and are isolated from the gate structure 120 by the spacer 180. In the embodiment, the material for the spacer 180 is such as silicon nitride, and the conductive material is such as tungsten metal. However, the material selections are depending on the conditions applied and are not limited to the materials aforementioned. As such, a semiconductor structure 1300 is formed.

In one embodiment, as shown in FIGS. 15A-15B, the semiconductor structure 1300 is such as a metal oxide semiconductor, and the range of the gate structure 120 defines the active region A of the semiconductor structure 1300. In this invention, the step of forming the gate structure 120 and the step of defining the active region A can be performed in one manufacturing process. As such, a gate does not have to be formed separately after an active region has been defined by disposing an insulating isolation structure. Further, a source contact, a drain contact, and a gate contact would not have to be formed after the insulating isolation structure has been disposed. Therefore, the whole manufacturing processes are simplified with a higher flexibility.

In the embodiment, as shown in FIGS. 15A-15B, the substrate 210 has a channel area 1311, and the distance D8 between the source conductive structure 140 and the drain conductive structure 130 is equal to the length L8 of the channel area 1311. In the embodiment, the spacer 180 is on the sidewall 140*a* of the source conductive structure 140 and the sidewall 130*a* of the drain conductive structure 130. In the embodiment, the spacer 180 is formed between the gate structure 120 and the source conductive structure 140 and between the gate structure 120 and the drain conductive structure 130. The sidewall 140*a* of the source conductive structure 140 and the sidewall 130*a* of the drain conductive structure 130 are fully covered by the spacer 180.

In the embodiment, as shown in FIGS. 15A-15B, after the drain conductive structure 130, the gate conductive structure 150, and the drain conductive structure 140 are formed, the insulating layer 170 is between the gate conductive structure 150, the source conductive structure 140, and the drain conductive structure 130.

Figure 16A:
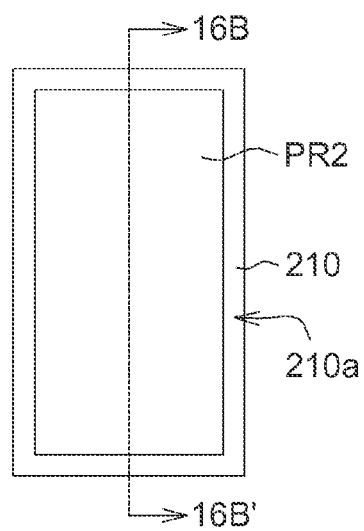
Figure 16B:
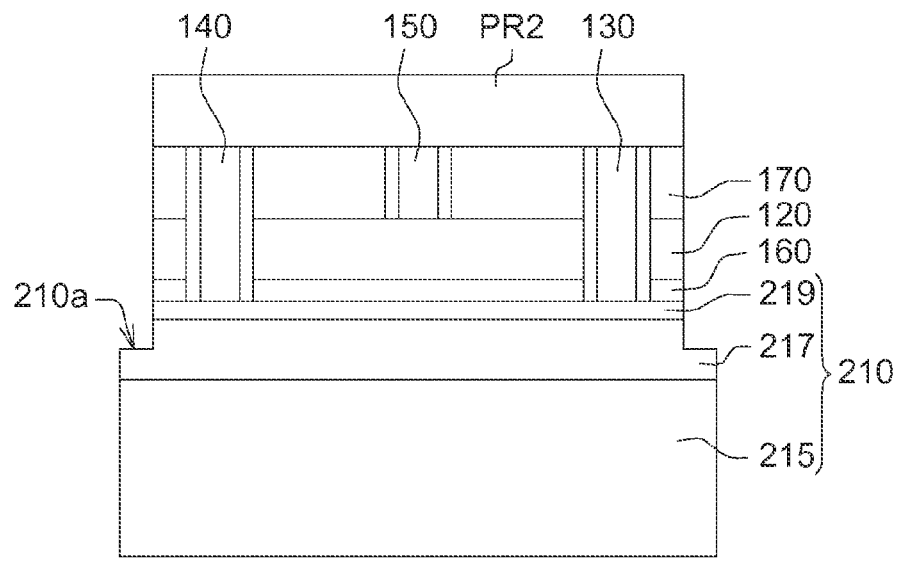
Figure 17A:
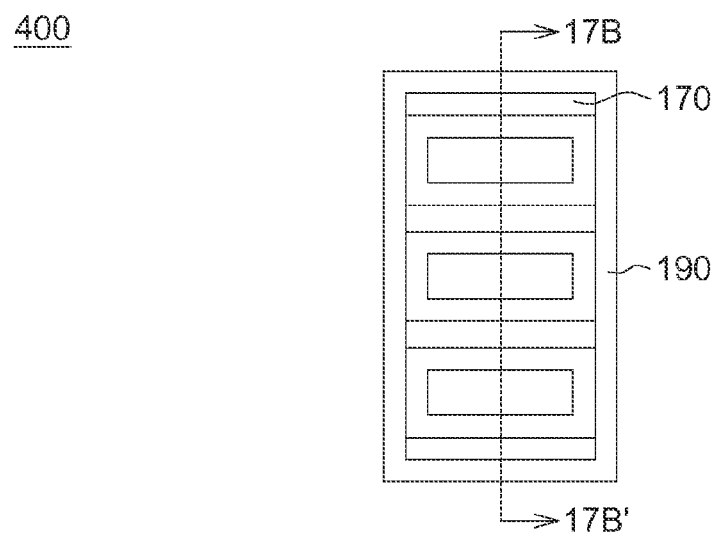
Figure 17B:
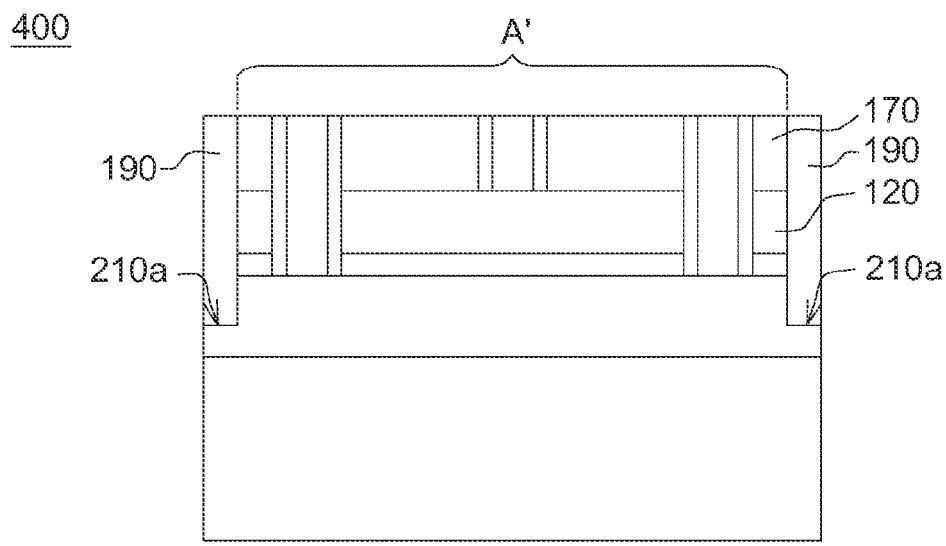

Next, referring to FIGS. 16A-17B, an insulating structure 190 is formed on the substrate 210 and surrounding the gate structure 120. The manufacturing method of forming the insulating structure 190 comprises such as the following steps. As shown in FIGS. 16A-16B (FIG. 16B shows a cross-sectional view along the section line 16B-16B' in FIG. 16A), the gate structure 120 and the substrate 210 are etched to expose a surface 210*a* of the substrate 210. In the embodiment, a photoresist PR2 is such as disposed on the drain conductive structure 130, the gate conductive structure 150, and the source conductive structure 140, and then, the portions of the insulating layer 170, the gate structure 120, the gate dielectric layer 160, the silicon layer 215, and the silicon oxide layer 217 uncovered by the photoresist PR2 are etched, and the exposed surface 210*a* is a portion of the silicon oxide layer 217. The region where the photoresist PR2 is disposed is the predetermined active region. Next, as shown in FIGS. 17A-17B (FIG. 17B shows a cross-sectional view along the section line 17B-17B' in FIG. 17A), an insulating structure 190 is formed on the surface 210*a* of the substrate. In the embodiment, the materials for the insulating structure 190 and the materials for the insulating layer 170 may be the same or different. The region surrounded by the insulating structure 190 can be the active region A'. As such, the semiconductor structure 400 as shown in FIGS. 5A-5B is formed.

FIGS. 18-22B illustrate a process for manufacturing a semiconductor structure according to another embodiment of the present disclosure. Please refer to FIGS. 12A-15B and FIGS. 18-22B.

Figure 18:
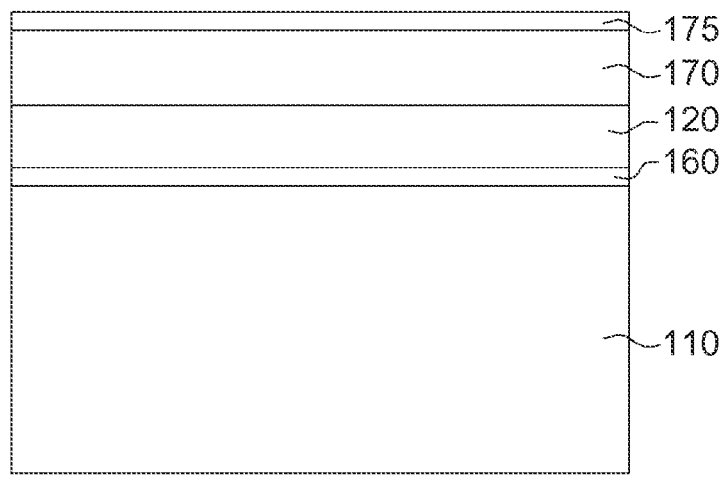
FIGS. 18-22B illustrate a process for manufacturing a semiconductor structure according to another embodiment of the present disclosure.

Referring to FIG. 18, a gate dielectric layer 160 is formed on a substrate 110, and a gate structure 120 is formed on the gate dielectric layer 160. Next, an insulating layer 170 is formed on the gate structure 120, and a barrier layer 185 is formed on the insulating layer 170. In the embodiment, the substrate is such as a polysilicon substrate with ion implanted p well, and the material for the barrier layer 175 us such as silicon nitride. However, the material selections are depending on the conditions applied and are not limited to the materials aforementioned.

Figure 19A:
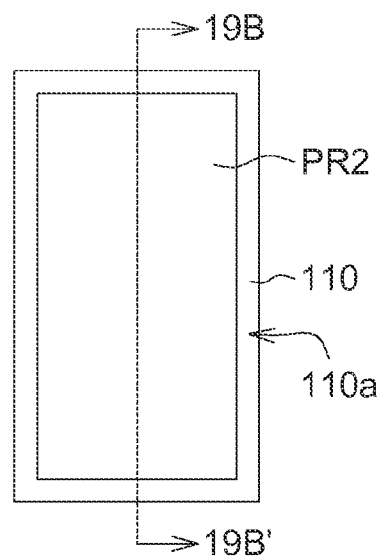
Figure 19B:
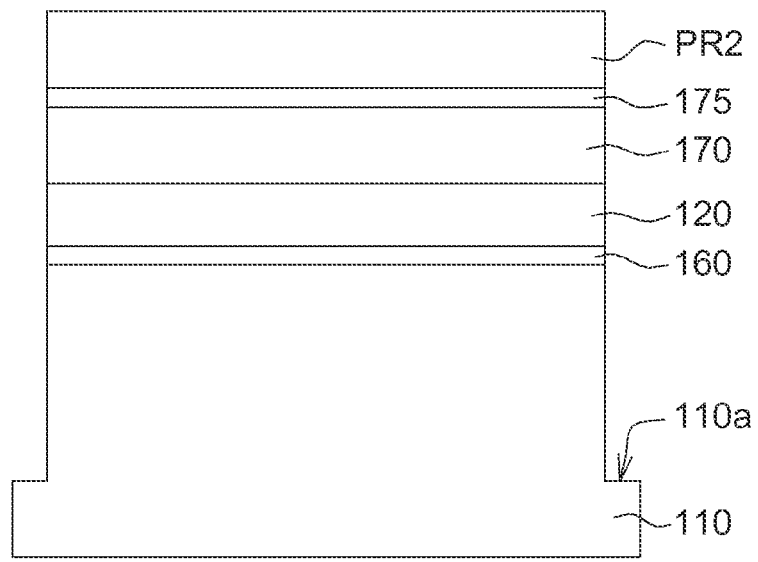
Figure 20A:
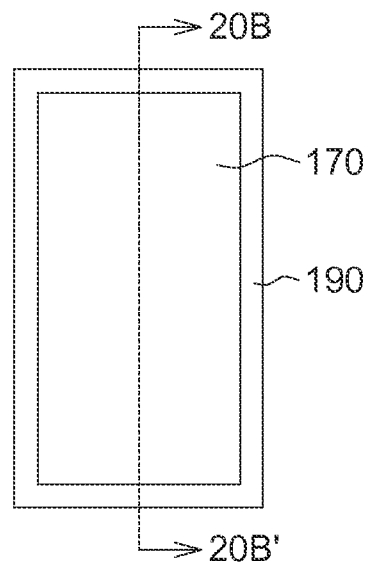
Figure 20B:
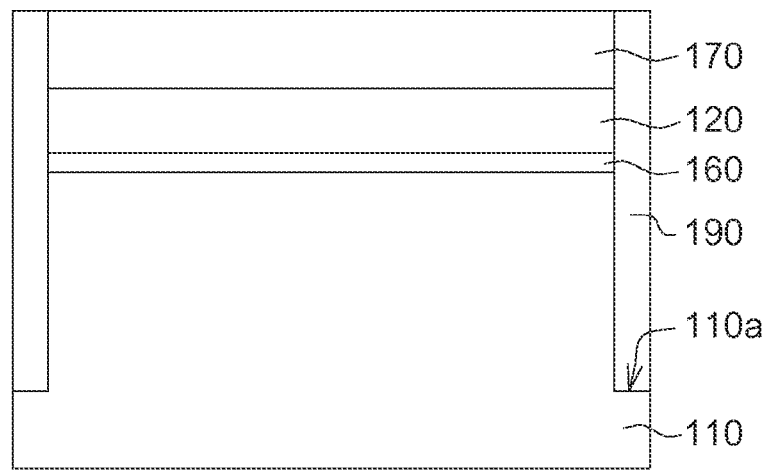

Next, referring to FIGS. 19A-20B, an insulating structure 190 is formed on the substrate 100 and surrounding the gate structure 120. The manufacturing method of forming the insulating structure 190 comprises such as the following steps. As shown in FIGS. 19A-19B (FIG. 19B shows a cross-sectional view along the section line 19B-19B' in FIG. 19A), a photoresist PR2 is disposed on a portion of the surface of the barrier layer 175, and then, the portions of the barrier layer 175, the insulating layer 170, the gate structure 120, the gate dielectric layer 160, and the substrate 110 uncovered by the photoresist PR2 are etched, and a surface 110*a* of the substrate 110 is exposed. The region where the photoresist PR2 is disposed is the predetermined active region. Next, as shown in FIGS. 20A-20B (FIG. 20B shows a cross-sectional view along the section line 20B-20B' in FIG. 20A), the insulating structure 190 is formed on the surface 110a of the substrate 110. And then, the photoresist PR2 and the barrier layer 175 can be removed, and the whole surface of the insulating structure 190 and the insulating layer 170 is planarized by such as a chemical mechanical polishing (CMP) process. In the embodiment, the materials for the insulating structure 190 and for the insulating layer 170 can be the same or different. The region surrounded by the insulating structure 190 can be the predetermined active region.

Next, referring to FIGS. 21A-22B, a source area 115 and a drain area 113 are formed in the substrate 110.

Figure 21A:
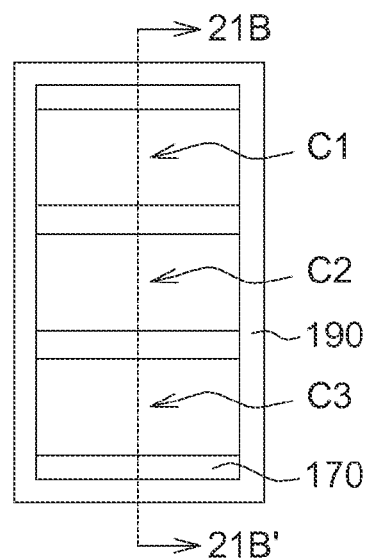
Figure 21B:
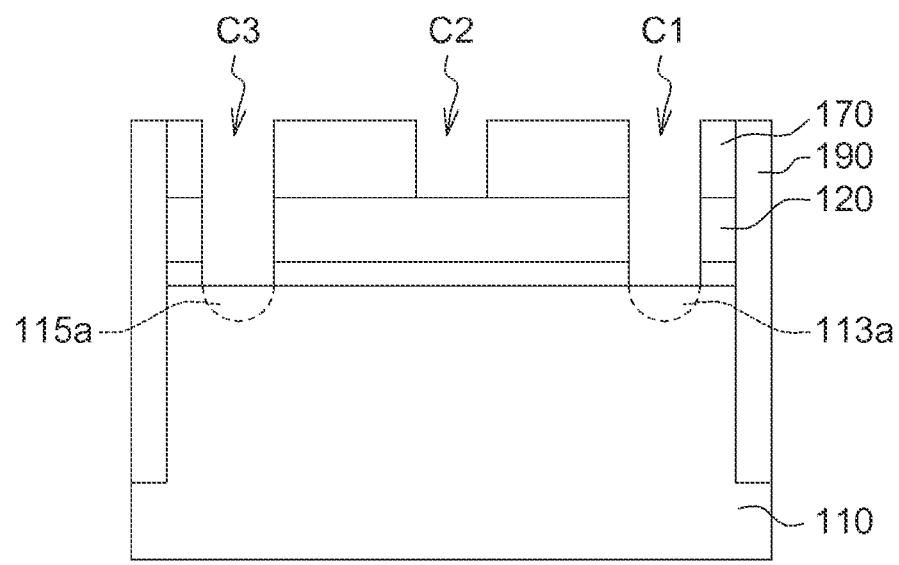
Figure 22A:
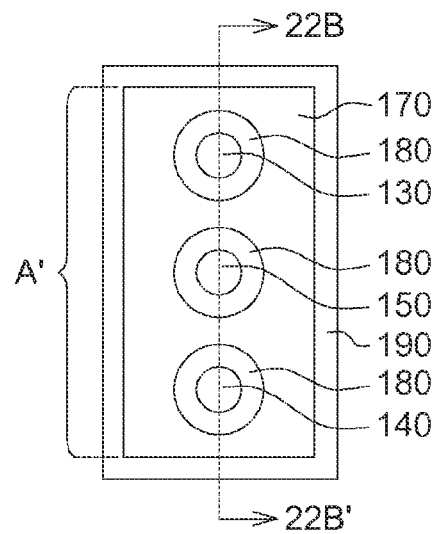
Figure 22B:
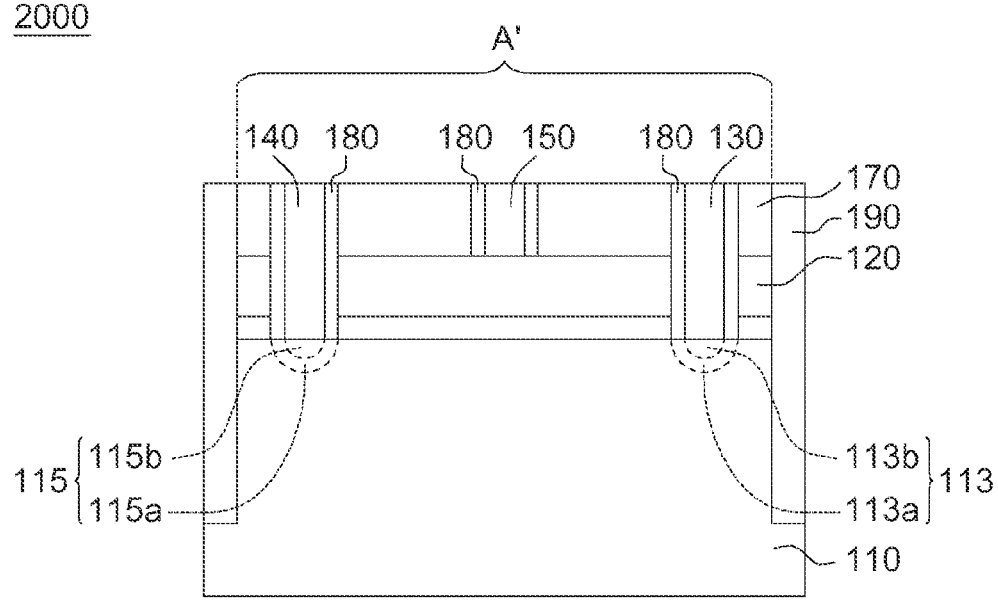

In the embodiment, the manufacturing method of forming the source area 115 and the drain area 113 in the substrate 110 comprises such as the following steps. As shown in FIGS. 12A-13B and 21A-21B (FIG. 21B shows a cross-sectional view along the section line 21B-21B' in FIG. 21A), holes C1, C2, and C3 are formed in the insulating layer 170. The height of hole C2 extends from a top surface of the insulating layer 170 to the interface of the insulating layer 170 and the gate structure 120, and the heights of holes C1 and C3 extend to the interface of the gate dielectric layer 160 and the substrate 110. Next, an ion implantation process is performed to the substrate 110 below the holes C1 and C3, respectively, to form first type doping areas 113a and 115a. The ranges of the first type doping areas 113a and 115a are determined by the ranges of the holes C1 and C3. Next, as shown in FIGS. 22A-22B (FIG. 22B shows a cross-sectional view along the section line 22B-22B' in FIG. 22A), a spacer 180 is formed on the sidewalls of the holes C1, C2, and C3, and performing an ion implantation process on the substrate 110 below the holes C1 and C3, respectively, to form second type doping areas 113b and 115b. The ranges of the second type doping areas 113b and 115b are determined by the inner edges of the spacers 180. In the embodiment, the first type doping area 113a and the second type doping area 113b below the hole C1 form the drain area 113, and the first type doping area 115a and the second type doping area 115b below the hole C2 form the source area 115. In the embodiment, the ranges of the width of the drain area 113 and the width of the source area 115 do not exceed the width of the hole C1 and the width of the hole C3, respectively.

Next, referring to FIGS. 22A-22B, a source conductive structure 140 and a drain conductive structure 130 are formed on the substrate, and a gate conductive structure 150 is formed on the gate structure 120. The source area 115 is located adjacent to the source conductive structure 140, and the drain area 113 is located adjacent to the drain conductive structure 130.

In the embodiment, the manufacturing method of forming the source conductive structure 140, the drain conductive structure 130, and the gate conductive structure 150 comprises such as the following steps. As shown in FIGS. 14A-15B and 22A-22B, a conductive material is filled in the holes C1, C2, and C3 to form the drain conductive structure 130, the gate conductive structure 150, and the source conductive structure 140 in the holes C1, C2, and C3, respectively. The drain conductive structure 130 and the source conductive structure 140 penetrate through the gate structure 120 and are isolated from the gate structure 120 by the spacer 180. As such, a semiconductor structure 2000 is formed.

In one embodiment, as shown in FIGS. 22A-22B, the semiconductor structure 2000 is such as a metal oxide semiconductor, and the insulating structure 190 defines the active region A' of the semiconductor structure 2000. In this invention, the step of etching the gate structure 120 and the step of etching the substrate 110 to define the range of the active region A' are performed in one manufacturing process. As such, a gate does not have to be formed separately after an active region has been defined by disposing an insulating isolation structure. Further, a source contact, a drain contact, and a gate contact would not have to be formed after the insulating isolation structure has been disposed. Therefore, the whole manufacturing processes are simplified with a higher flexibility.

Conventionally, the formation of the interlayer dielectric and the contact window (contact hole) process are performed after the source area and the drain area are formed by an ion implantation process. In contrast, in this invention, the source area 115 and the drain area 113 are formed after the insulating layer 170 (e.g. interlayer dielectric) and the holes C1, C2, and C3 (e.g. contact window process) are formed. Thus, the number of the manufacturing processes (e.g. thermal treatments) after the ion implantation process is reduced, such that the ranges of ion implantation (e.g. the ranges of the source area 115 and the drain area 113) are less influenced by the subsequent processes. As such, the ranges of the source area 115 and the drain area 113 can be controlled more precisely, and hence the efficiency of the semiconductor structure 2000 is improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a substrate having a channel area;
a gate dielectric layer formed on the channel area;
a gate structure formed on the gate dielectric layer;
a source conductive structure and a drain conductive structure penetrating through the gate structure and electrically connected to the substrate, and the source conductive structure and the drain conductive structure are electrically isolated from the gate structure; and
a gate conductive structure formed on the gate structure, wherein the source conductive structure and the drain conductive structure are separated by a distance which is equal to a length of the channel area.

2. The semiconductor structure according to claim 1, further comprising a spacer formed on a sidewall of the source conductive structure and a sidewall of the drain conductive structure.

3. The semiconductor structure according to claim 2, wherein the spacer is formed between the gate structure and the source conductive structure and between the gate structure and the drain conductive structure.

4. The semiconductor structure according to claim 3, wherein the spacer is in direct contact with the gate structure, the source conductive structure, and the drain conductive structure.

5. The semiconductor structure according to claim 2, wherein the spacer fully covers the sidewall of the source conductive structure and the sidewall of the drain conductive structure.

6. The semiconductor structure according to claim 1, wherein a shape of cross-sections of the gate conductive structure, the source conductive structure, and the drain conductive structure is rectangular, round, oval-shaped, or linear.

7. The semiconductor structure according to claim 1, further comprising an insulating layer formed on the substrate and located between the gate conductive structure, the source conductive structure, and the drain conductive structure.

8. The semiconductor structure according to claim 1, further comprising an insulating structure formed on the substrate and surrounding the gate structure.

9. The semiconductor structure according to claim 1, further comprising an insulating structure formed on the substrate surrounding the substrate, and a part of a surface of the substrate is exposed from the insulating structure.

10. The semiconductor structure according to claim 1, wherein the substrate is a polysilicon substrate or a SOI (silicon on insulator) substrate.

11. The semiconductor structure according to claim 1, wherein the gate conductive structure is disposed on the same side of the drain conductive structure and the source conductive structure.

12. A manufacturing method of a semiconductor structure, comprising:
    forming a gate dielectric layer on a substrate;
    forming a gate structure on the gate dielectric layer;
    forming a source conductive structure and a drain conductive structure on the substrate, wherein the source conductive structure and the drain conductive structure penetrate through the gate structure and are electrically connected to the substrate, and the source conductive structure and the drain conductive structure are electrically isolated from the gate structure; and
    forming a gate conductive structure on the gate structure; wherein the substrate has a channel area, the source conductive structure and the drain conductive structure are separated by a distance which is equal to a length of the channel area.

13. The method of manufacturing the semiconductor structure according to claim 12, further comprising:
    forming a spacer on a sidewall of the drain conductive structure and a sidewall of the drain conductive structure.

14. The method of manufacturing the semiconductor structure according to claim 13, wherein the step of forming the spacer comprises:
    forming the spacer between the gate structure and the source conductive structure and between the gate structure and the drain conductive structure.

15. The method of manufacturing the semiconductor structure according to claim 13, wherein the step of forming the spacer comprises:
    fully covering the sidewall of the source conductive structure and the sidewall of the drain conductive structure with the spacer.

16. The method of manufacturing the semiconductor structure according to claim 12, further comprising:
    forming an insulating layer on the substrate, and the insulating layer is located between the gate conductive structure, the source conductive structure, and the drain conductive structure.

17. The method of manufacturing the semiconductor structure according to claim 12, further comprising:
    forming an insulating structure on the substrate, and the insulating structure surrounds the gate structure.

18. The method of manufacturing the semiconductor structure according to claim 17, further comprising:
    etching the gate structure and the substrate to expose a surface of the substrate; and
    forming the insulating structure on the exposed surface of the substrate.

19. The method of manufacturing the semiconductor structure according to claim 12, wherein the substrate is a polysilicon substrate or a SOI (silicon on insulator) substrate.

20. The method of manufacturing the semiconductor structure according to claim 12, further comprising:
    forming a source area and a drain area in the substrate, wherein the source area is located adjacent to the source conductive structure, and the drain area is located adjacent to the drain conductive structure.

* * * * *